(12) United States Patent
Nonaka

(10) Patent No.: US 8,460,994 B2
(45) Date of Patent: Jun. 11, 2013

(54) BIPOLAR SEMICONDUCTOR DEVICE AND MANUFACTURING METHOD THEREOF

(75) Inventor: Ken-ichi Nonaka, Wako (JP)

(73) Assignee: Honda Motor Co., Ltd., Tokyo (JP)

( * ) Notice: Subject to any disclaimer, the term of this patent is extended or adjusted under 35 U.S.C. 154(b) by 931 days.

(21) Appl. No.: 11/919,350

(22) PCT Filed: Jun. 9, 2006

(86) PCT No.: PCT/JP2006/312077
§ 371 (c)(1),
(2), (4) Date: Sep. 23, 2009

(87) PCT Pub. No.: WO2006/135031
PCT Pub. Date: Dec. 21, 2006

(65) Prior Publication Data
US 2010/0001290 A1 Jan. 7, 2010

(30) Foreign Application Priority Data
Jun. 13, 2005 (JP) .................. P2005-172620

(51) Int. Cl.
*H01L 21/331* (2006.01)
(52) U.S. Cl.
USPC ........... 438/235; 438/346; 438/353; 438/317; 257/547; 257/361
(58) Field of Classification Search
USPC .................. 257/547, 361; 438/235, 346, 353, 438/317
See application file for complete search history.

(56) References Cited

U.S. PATENT DOCUMENTS

| | | | |
|---|---|---|---|
| 4,945,394 A | 7/1990 | Palmour et al. | |
| 4,979,009 A | 12/1990 | Kusano et al. | |
| 5,767,540 A | 6/1998 | Shimizu et al. | |
| 6,355,947 B1 | 3/2002 | Niwa et al. | |
| 6,462,362 B1 * | 10/2002 | Miyoshi | 257/198 |
| 2003/0160266 A1 | 8/2003 | Yanagisawa | |
| 2003/0222329 A1 | 12/2003 | Fresart et al. | |

FOREIGN PATENT DOCUMENTS

| | | | |
|---|---|---|---|
| JP | 60-074571 | | 4/1985 |
| JP | 64-5063 A | | 1/1989 |
| JP | 11-214405 A | | 8/1999 |
| JP | 2002-359378 A | | 12/2002 |
| JP | 2003-203916 | | 7/2003 |
| JP | 2003203916 | * | 7/2003 |
| WO | WO-00/65636 A2 | | 11/2000 |

OTHER PUBLICATIONS

Zhang et al., "High Power (500V-70A) and High Gain (44-47) 4H-SiC Bipolar Junction Transistors," Materials Science Forum, vols. 457-460, 2004, pp. 1149-1152.

* cited by examiner

*Primary Examiner* — Julio J Maldonado
*Assistant Examiner* — Mohammad Choudhry
(74) *Attorney, Agent, or Firm* — Birch, Stewart, Kolasch & Birch, LLP

(57) ABSTRACT

A semiconductor crystal includes a recombination-inhibiting semiconductor layer (17) of a second conductive type that is disposed in the vicinity of the surface between a base contact region (16) and emitter regions (14) and that separates the semiconductor surface having a large number of surface states from the portion that primarily conducts the positive hole electric current and the electron current. Recombination is inhibited, and the current amplification factor is thereby improved and the ON voltage reduced.

11 Claims, 7 Drawing Sheets

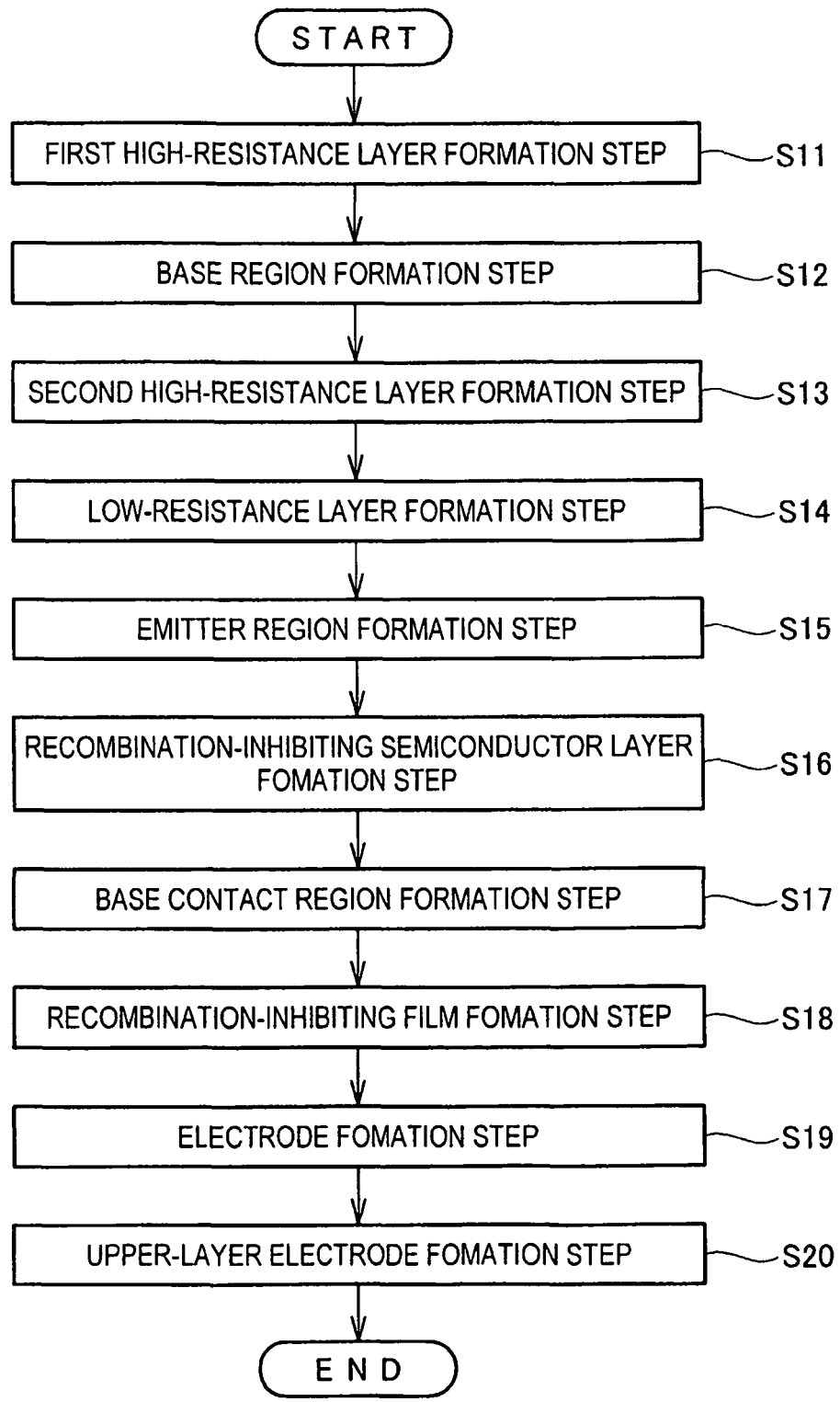

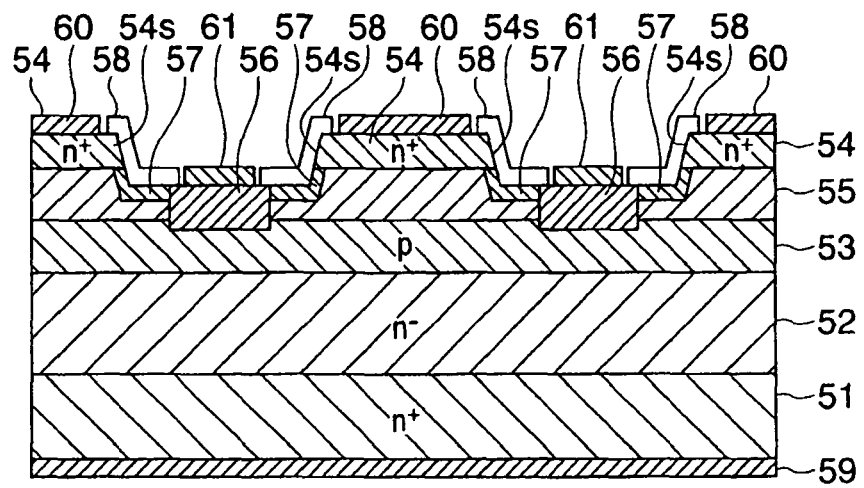
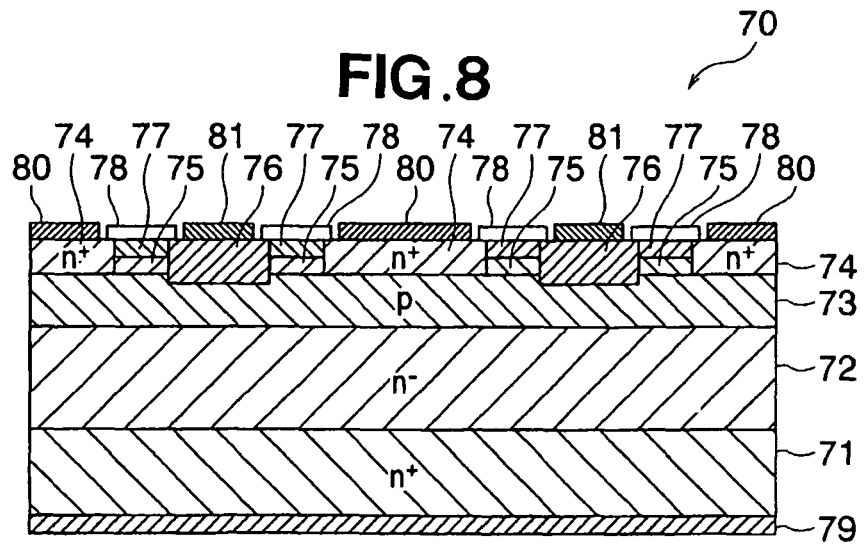

a bipolar semiconductor device that is suitable for inhibiting recombination between electrons from the emitter regions and positive holes from the base region on the semiconductor surface, and to a manufacturing method thereof.

BIPOLAR SEMICONDUCTOR DEVICE AND MANUFACTURING METHOD THEREOF

TECHNICAL FIELD

The present invention relates to a bipolar semiconductor device and a manufacturing method thereof, and more particularly relates to a bipolar semiconductor device that is suitable for inhibiting recombination between electrons from the emitter regions and positive holes from the base region on the semiconductor surface, and to a manufacturing method thereof.

BACKGROUND ART

Semiconductor silicon carbide (SiC) has considerable bandgap energy in comparison with silicon that is widely used in devices, and is therefore suitable for high-voltage, high-power, and high-temperature operation. There are high expectations for the application of silicon carbide to power devices and other components. The structure of SiC power devices, for which research and development are being actively carried out, can mainly be divided into two classes: MOS devices and junction devices. The present invention relates to a performance improvement in bipolar transistors, which are junction devices.

Following is a reported example of an SiC bipolar transistor.

An example of a typical bipolar transistor has been described in *High Power (500 V-70 A) and High Gain* (44-47) *4H-SiC Bipolar Junction Transistors* (J. Zhang, et al., Materials Science Forum, Vols. 457-460 (2004) pp. 1149-1152). The bipolar transistor described therein is formed by laminating an n$^-$-type high resistance region, a p-type base region, and n$^+$-type emitter regions in the stated order on the surface of a low-resistance n$^+$-type 4H-SiC substrate that is misoriented by 8 degrees to (0001), and the emitter regions are composed of a plurality of long narrow regions. Electrodes are formed in the emitter regions, base region, and collector region to make electrical connections to the exterior.

FIG. 9 shows a cross-sectional schematic view of the bipolar transistor disclosed in the above-described reference. The bipolar transistor 100 is provided with a collector region 101, which is an n-type low-resistance layer; an n-type high resistance region 102; a p-type base region 103; n-type low-resistance emitter regions 104, a p-type low-resistance base contact region 105 formed around the emitter regions; a collector electrode 106; a base electrode 107; emitter electrodes 108; and a surface protective film 109.

FIG. 10 is a drawing that illustrates the typical operation of the bipolar transistor 100. In FIG. 10, the same reference numerals are assigned to the same constituent elements as those shown in FIG. 9. The surface protective film 109 is omitted from FIG. 10 in that the film does not directly relate to the description of the operation.

In the bipolar transistor 100 shown in FIGS. 9 and 10, the main electric current is produced by electrons shown by the arrow 110 that flow from the emitter regions 104 to the collector region 101. The on/off state of the electron current is controlled by a voltage signal applied to the base electrode 107. The direction in which the main electric current flows at this time is the direction facing from the collector region 101 to the emitter regions 104. The bipolar transistor 100 is in an off-state when the voltage between the base electrode 107 and the emitter electrodes 108 is 0 V or less, and changes to an on-state when a positive voltage is applied between the base electrode 107 and the emitter electrodes 108. When the bipolar transistor 100 is in an on-state, the pn junction formed between the base electrode 107 and the emitter electrodes 108 is set with a forward bias, and an electric current based on positive holes flows from the base electrode 107 to the emitter electrodes 108.

A stronger main electric current 110 is preferably controlled with a weaker base electric current in order to operate the bipolar transistor 100 at high efficiency. The current amplification factor (=main electric current/base electric current) is therefore a required parameter. A cause that reduces the current amplification factor is the recombination state on the semiconductor surface such as that schematically shown by the symbol "x," which is indicated by the reference symbol 111 in the FIG. 10. A large number of surface states caused by uncombined atoms, crystal defects, and the like ordinarily exist on the surface of the semiconductor.

By thermally oxidizing the silicon surface, for example, it is possible to create a silicon/oxide film interface with a low surface-state density that does not negatively affect the device characteristics. On the other hand, it is currently impossible, for example, to sufficiently reduce the surface-state density on the surface of the SiC by using heat oxidation or the subsequently performed heat treatment (POA: Post Oxidation Annealing) and the like. The surface states of the semiconductor surface act as recombination states. For this reason, when the main electric current 110 is ON, electrons 113 injected from the emitter regions 104 and positive holes 112 in the base region 103 coexist in areas of high concentrations of recombination states 111 brought about by the surface states of the surface of the base region 103, as is schematically shown in FIG. 10. The positive holes and electrons (indicated by the arrows 115 and 116) thereby actively recombine, and since reactive base electric current flows without contributing to the operation of the device, the current amplification factor is reduced as a result.

There is a problem in a conventional bipolar transistor 100 in that the positive holes in the base region 103 and the electrons injected from the emitter regions 104 recombine via the surface states of the surface of the base region 103, and the current amplification factor is reduced when a positive voltage is applied between the base electrode and collector electrodes to switch on the device.

There is therefore a need to provide a high-performance bipolar semiconductor device and a manufacturing method thereof which can be applied to a device for controlling the motor of an automobile and to other devices, in which the recombination of positive holes and electrons that is produced via the surface states of the semiconductor surface can be controlled, and in which the current amplification factor is improved.

DISCLOSURE OF THE INVENTION

According to one aspect of the present invention, there is provided a bipolar semiconductor device which comprises a collector region comprising a low-resistance layer of a first conductive type formed on one of the surfaces of a semiconductor crystal, a high-resistance layer of a first conductive type disposed on the collector region, a base region of a second conductive type disposed on the high-resistance layer of a first conductive type, low-resistance emitter regions of a first conductive type formed on the other surface of the semiconductor crystal, and a low-resistance base contact region of a second conductive type joined to the base region and disposed on both sides of the high-resistance layer of a first conductive type at the periphery of the emitter regions; and further having a recombination-inhibiting semiconductor layer of a second conductive type in the vicinity of the surface of the semiconductor crystal between the base contact region and the emitter regions.

In the present invention, a recombination-inhibiting semiconductor layer of a second conductive type is disposed in the vicinity of the surface of the semiconductor crystal between the base contact region and the emitter regions. By providing a recombination-inhibiting semiconductor layer, the semiconductor surface having a large number of surface states is separated from the portion that primarily conducts the positive hole electric current and the electron current, and recombination is inhibited. The current amplification factor can thereby be improved, the ON voltage can be reduced, and the efficiency of a power conversion device can be enhanced by using the bipolar transistor of the present invention.

According to another aspect of the present invention, there is provided a bipolar semiconductor device which comprises a collector region comprising a low-resistance layer of a first conductive type formed on one of the surfaces of a semiconductor crystal, a high-resistance layer of a first conductive type disposed on the collector region, a base region of a second conductive type disposed on the high-resistance layer of a first conductive type, low-resistance emitter regions of a first conductive type formed on the other surface of the semiconductor crystal, and a low-resistance base contact region of a second conductive type joined to the base region and disposed on both sides of the high-resistance layer of a first conductive type at the periphery of the emitter regions; and further having a recombination-inhibiting semiconductor layer of a first conductive type in the vicinity of the surface of the semiconductor crystal between the base contact region and the emitter regions.

In the present invention, a recombination-inhibiting semiconductor layer of a first conductive type is disposed in the vicinity of the surface of the semiconductor crystal between the base contact region and the emitter regions. By providing a recombination-inhibiting semiconductor layer, the semiconductor surface having a large number of surface states is separated from the portion that primarily conducts the positive hole electric current and the electron current, and recombination is inhibited. The current amplification factor can thereby be improved, the ON voltage can be reduced, and the efficiency of a power conversion device can be enhanced by using the bipolar transistor of the present invention.

The bipolar semiconductor device described above is preferably configured so that the surface of the semiconductor between the base contact region and the emitter regions is partly sloped.

The bipolar semiconductor device described above is preferably configured so that the surface of the semiconductor between the base contact region and the emitter regions is not stepped.

The bipolar semiconductor device described above is preferably configured so that the surface of the semiconductor crystal between the base contact region and the emitter regions is provided with a recombination-inhibiting film. The device characteristics can be further improved by combining a recombination-inhibiting semiconductor layer with a recombination-inhibiting film that reduces recombination on the surface of the semiconductor.

The bipolar semiconductor device described above is preferably configured with a semiconductor crystal that is silicon carbide.

The bipolar semiconductor device described above is preferably configured so that the impurity concentration of the recombination-inhibiting semiconductor layer is lower than the impurity concentration of the base region.

According to yet another aspect of the present invention, there is provided a manufacturing method for a bipolar semiconductor device, which comprising the steps of forming a first high-resistance layer of a first conductive type on one of the surfaces of a semiconductor substrate of a first conductive type; forming a base region of a second conductive type on the first high-resistance layer of a first conductive type; forming a second high-resistance layer of a first conductive type on the base region; forming a low-resistance layer of a first conductive type on the second high-resistance layer of a first conductive type; forming emitter regions by partially etching a portion of the low-resistance layer and the second high-resistance layer; forming a recombination-inhibiting semiconductor layer of a second conductive type in the vicinity of the surface of the second high-resistance layer that was exposed by the etching; forming a base contact region joined to the base region; joining a base electrode to the base contact region, emitter electrodes to the emitter regions, and a collector electrode to the other surface of the semiconductor substrate; and forming an upper-layer electrode above the base electrode and the emitter electrodes.

According to still another aspect of the present invention, there is provided a manufacturing method for a bipolar semiconductor device, which comprises the steps of forming a first high-resistance layer of a first conductive type on one of the surfaces of a semiconductor substrate of a first conductive type; forming a base region of a second conductive type on the first high-resistance layer of a first conductive type; forming a second high-resistance layer of a first conductive type on the base region; forming a low-resistance layer of a first conductive type on the second high-resistance layer of a first conductive type; forming emitter regions by partially etching a portion of the low-resistance layer and the second high-resistance layer; forming a recombination-inhibiting semiconductor layer of a second conductive type in the vicinity of the surface of the second high-resistance layer that was exposed by the etching; forming a base contact region joined to the base region; forming a recombination-inhibiting film on the surface of the semiconductor crystal between the base region and the emitter regions; joining a base electrode to the base contact region, emitter electrodes to the emitter regions, and a collector electrode to the other surface of the semiconductor substrate; and forming an upper-layer electrode above the base electrode and the emitter electrodes.

BRIEF DESCRIPTION OF THE DRAWINGS

Preferred examples of the present invention are described in detail below with reference to the attached diagrams, wherein:

FIG. 4 is a flowchart that shows the steps for manufacturing a bipolar transistor by using the manufacturing method of the bipolar semiconductor device of the first example of the present invention;

FIG. 7 is a cross-sectional view of the bipolar semiconductor device of the second example of the present invention;

FIG. 8 is a cross-sectional view of the bipolar semiconductor device of the third example of the present invention;

BEST MODE FOR CARRYING OUT THE INVENTION

Figure 1:
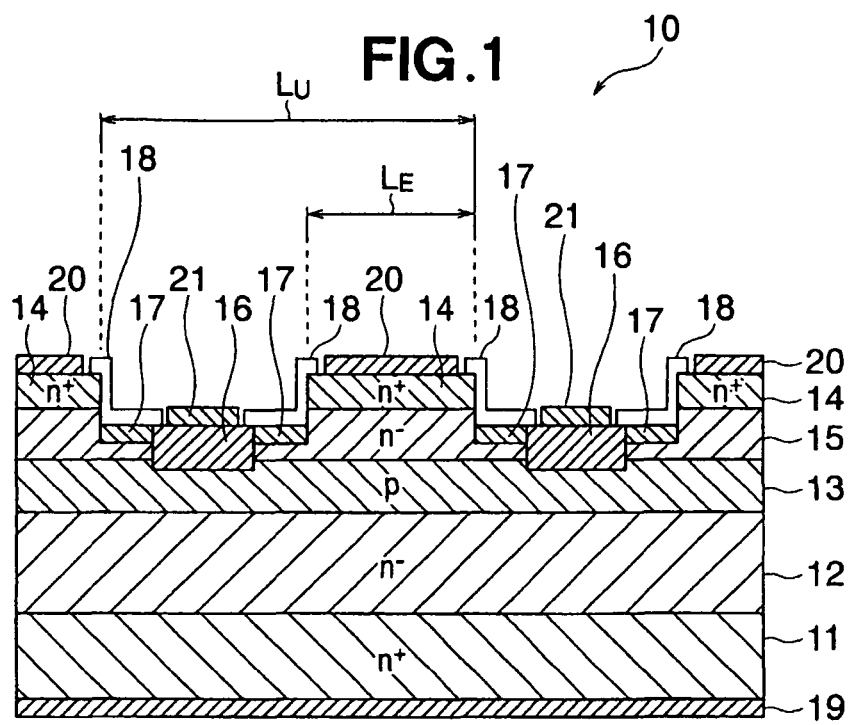
FIG. 1 is a cross-sectional view of a portion of the bipolar semiconductor device (using a bipolar transistor as an example) of the first example of the present invention.
Figure 2:
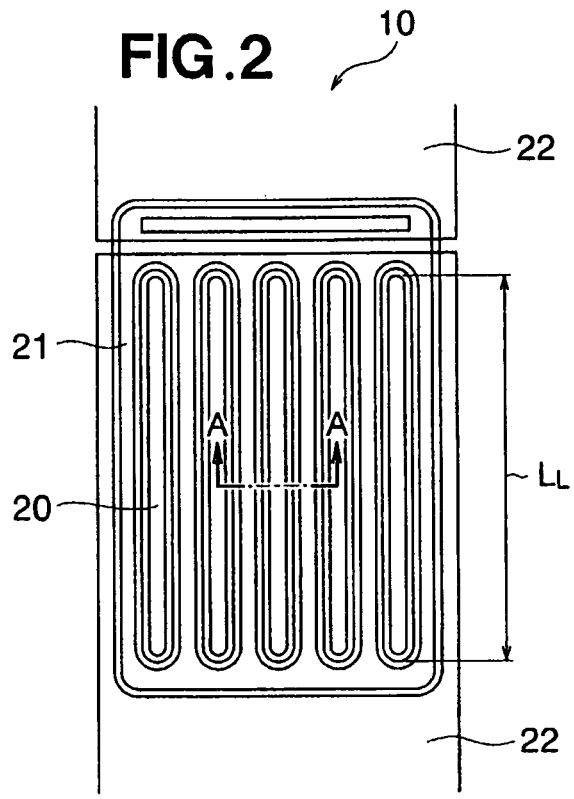
FIG. 2 is a plan view of the bipolar semiconductor device (using a bipolar transistor as an example) of the first example of the present invention.
Figure 3:
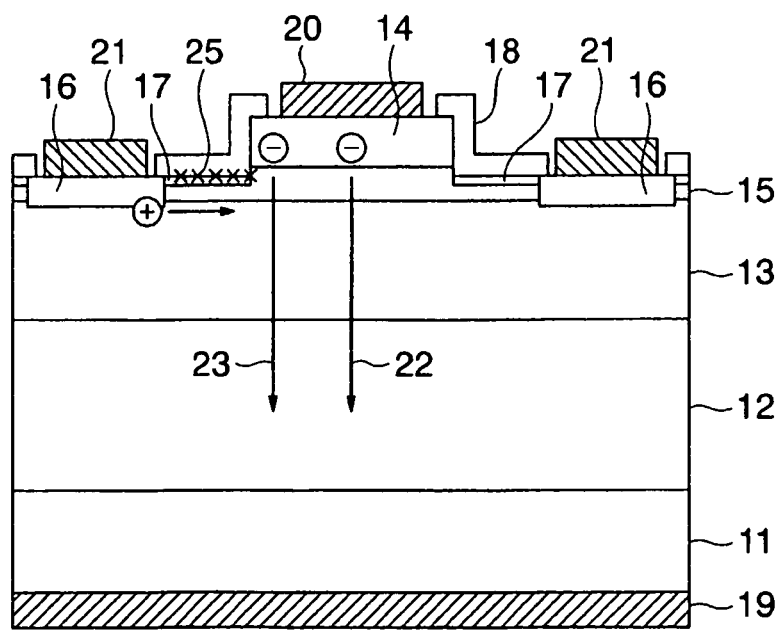
FIG. 3 is a diagram for describing the operation of the bipolar semiconductor device of the first example.

The bipolar semiconductor device (bipolar transistor) of the first example is described first with reference to FIGS. 1 to 3.

FIG. 2 shows an example of a flat structure of a bipolar transistor with five emitter electrodes. FIG. 1 is an enlarged view of the cross-sectional structure along the line A-A of FIG. 2.

The bipolar transistor 10 has a collector region 11 composed of an n-type (first conductive type) low-resistance layer ($n^+$ layer) formed on one of the surfaces of a silicon carbide (SiC) crystal, an n-type high-resistance layer ($n^-$ layer) 12 disposed on the collector region 11, a p-type (second conductive type) base region 13 disposed on the n-type high-resistance layer 12, n-type low-resistance ($n^+$) emitter regions 14 formed on the other surface of the SiC crystal, and p-type low-resistance ($p^+$) base contact region 16 joined to the base region 13 and disposed on both sides of an n-type high-resistance layer ($n^-$ layer) 15 at the periphery of the emitter regions 14.

The bipolar transistor 10 is provided with the base contact region 16 and a p-type recombination-inhibiting semiconductor layer 17 in the vicinity of the surface of the SiC crystal between the emitter regions 14.

A recombination-inhibiting film 18 is also disposed in the bipolar transistor 10 on the surface of the SiC crystal between the base contact region 16 and the emitter regions 14. The bipolar transistor 10 is also provided with a collector electrode 19 joined to the collector region 11, emitter electrodes 20 joined to the emitter regions 14, and a base electrode 21 joined to the base contact region 16.

FIG. 2 also shows an upper-layer electrode 22 that is disposed in the area above the emitter electrodes 20 and base electrode 21.

Also, in this bipolar transistor 10, the impurity concentration of the recombination-inhibiting semiconductor layer 17 is lower than the impurity concentration of the base region 13.

The operation of the bipolar transistor of the present example is described next with reference to FIG. 3. In FIG. 3, the same reference numerals are assigned to the same constituent elements shown in FIG. 1. The main electric current is an electric current produced by the electrons that are indicated by the arrows 22 and 23 and that flow from the emitter regions 14 to the collector region 11 shown in the drawing. The ON/OFF control of the flow of the electron current is controlled by a voltage signal applied to the base electrode 21. In this situation, the direction of the flow of the main electric current is the direction that faces from the collector region 11 to the emitter regions 14.

The bipolar transistor 10 is in an off-state when the voltage between the base electrode 21 and the emitter electrodes 20 is 0 V or less, and switches to an on-state when a positive voltage is applied between the base electrode 21 and the emitter electrodes 20. When the bipolar transistor 10 is ON, the pn junction formed between the base electrode 21 and the emitter electrodes 20 is set in a forward bias, and a positive hole electric current flows from the base region 13 to the emitter regions 14.

Figure 10:
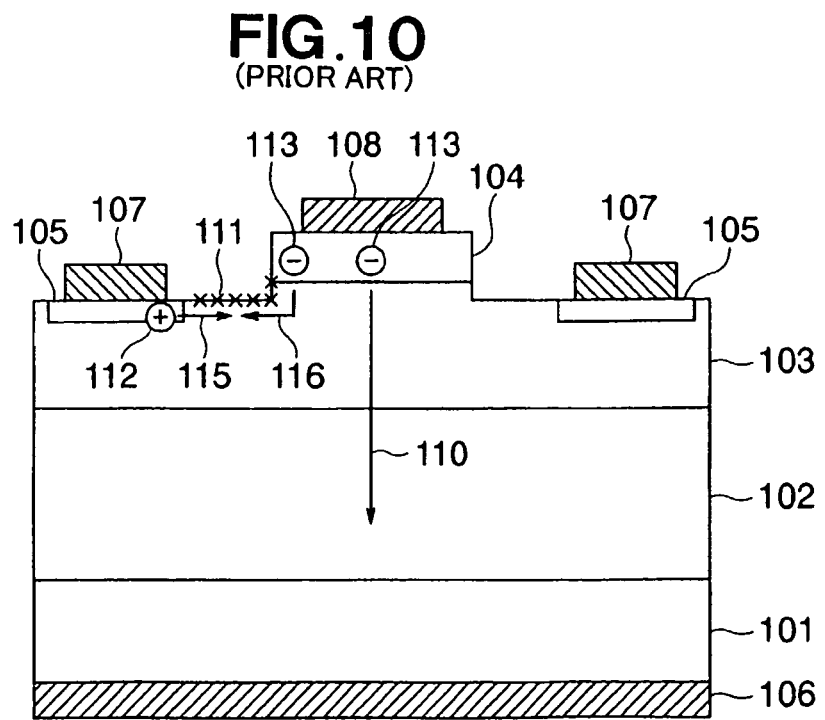
FIG. 10 is a diagram that describes the operation of a conventional bipolar transistor.

In the conventional structure shown in FIG. 10, when the bipolar transistor 100 is ON as described above, the positive holes 112 in the base region 103 and the electrons 113 injected from the emitter regions 104 coexist in areas of high concentrations of recombination states 111 brought about by the surface states of the surface of the base region 103. The positive holes and electrons thereby actively recombine, as indicated by the arrows 115 and 116, reactive base electric current flows without contributing to the operation of the device, and the current amplification factor is reduced However, a recombination-inhibiting semiconductor layer 17 and a recombination-inhibiting film 18 are provided to the structure of the example of the present invention, as shown in FIGS. 1 and 3. Therefore, the layer keeps the positive holes of the base region 13 and the electrons injected from the emitter regions 14 away from the surface having a large number of surface states (shown by the symbols "x" and indicated by the reference numeral 25 in FIG. 3) that act as recombination states, and recombination is inhibited. As a result, the number of recombining positive holes is reduced and the current amplification factor is increased. The device characteristics can thereby be further improved.

In the bipolar transistor 10 of the present example, the electric potential with respect to the electrons in this region is increased because the recombination-inhibiting semiconductor layer 17 described above is provided. Therefore, the electrons injected from the emitter regions 14 are kept away from the semiconductor surface having a large number of surface states. Also, the concentration of positive holes is low because the impurity concentration of the recombination-inhibiting semiconductor layer is lower than the impurity concentration of the base region. As a result, the probability of recombination at the surface states can be reduced. In the bipolar transistor 10, the device characteristics can be further improved by providing a recombination-inhibiting film 18 for reducing recombination purposes to the semiconductor surface between the emitter electrodes 20 and the base electrode 21, and using this in combination with the recombination-inhibiting semiconductor layer 17.

Next, the structure of the bipolar transistor 10 of the first example is further described in detail.

A low-resistance n-type 4H-SiC substrate that is misoriented by 8 degrees from the (0001) plane is used as the semiconductor crystal substrate of the bipolar transistor 10. In the bipolar transistor 10, this substrate is the collector region 11. The n-type high-resistance layer 12 on the substrate is a layer for preventing high voltage from being applied between the emitter electrodes 20 and collector electrode 19. In the present example, the thickness is set to 10 μm and the impurity concentration is set to $1 \times 10^{16}$ cm$^{-3}$ so that a voltage of 600 V or higher, for example, is prevented. The thickness and impurity concentration are set so that the p-type base region 13 on the n-type high-resistance layer 12 is not depleted when a high voltage is applied between the emitter electrodes 20 and collector electrode 19. A thickness of 0.5 to 1.0 μm and an impurity concentration of about $1 \times 10^{17}$ to $5 \times 10^{17}$ cm$^{-3}$ can be used, for example. Low-resistance n-type emitter regions 14 with a thickness of 0.2 to 0.4 μm and an impurity concentration of $1 \times 10^{19}$ to $4 \times 10^{19}$ cm$^{-3}$ is disposed on the base region 13 by way of an n-type high-resistance layer 15 that has a thickness of 0.2 to 0.4 μm and an impurity concentration of $1\times10^{16}$ cm$^{-3}$. The emitter regions 14 are regions to which the emitter electrodes 20 shown in FIG. 2 are joined and are divided into a plurality of long narrow shapes. A base electrode 21 is disposed in the separate regions. Each of the emitter regions 14 has a width of 10 to several tens of micrometers, as indicated by the symbol "$L_E$" in FIG. 1, and a length of about 100 to 1,000 μm, as indicated by the symbol "$L_L$" in FIG. 2. The period (indicated by the symbol "Lu" in FIG. 1) of a unit device that includes the base electrode 21 and the emitter electrodes 20 is about 20 to several tens of micrometers.

Next, the manufacturing method of the bipolar transistor 10 of the first example is described with reference to FIGS. 4, 5A to 5D, and 6A to 6D.

FIG. 4 is a flowchart that shows the steps for manufacturing a bipolar transistor. FIGS. 5A to 5D and 6A to 6D are cross-sectional views showing the structure at each step.

The manufacturing method of the bipolar transistor 10 is composed of the steps of forming: a first high-resistance layer (step S11), a base region (step S12), a second high-resistance layer (step S13), a low-resistance layer (step S14), emitter regions (step S15), a recombination-inhibiting semiconductor layer (step S16), a base contact region (step S17), a recombination-inhibiting film (step S18), electrodes (step S19), and an upper-layer electrode (step S20).

The step for forming a first high-resistance layer (step S11) is a step in which an n-type high-resistance layer 31 is formed on an n-type (first conductive type) SiC semiconductor substrate 30. In this step, an SiC layer 31 doped with nitrogen to a concentration of $1\times10^{16}$ cm$^{-3}$ as an impurity is grown to a thickness of 10 μm by using epitaxial growth on the SiC high-concentration n-type substrate 30, as shown in FIG. 5, for example.

The step for forming a base region (step S12) is a step in which a p-type (second conductive type) base region 32 is formed. In this step, SiC 32 doped with aluminum to a concentration of $1\times10^{17}$ to $1\times10^{19}$ cm$^{-3}$ as an impurity is grown to a thickness of 0.1 to 0.5 μm, for example, by using epitaxial growth.

The step for forming a second high-resistance layer (step S13) is a step in which an n-type high-resistance layer 33 is formed. In this step, an n-type high-resistance layer 33 composed of SiC doped with nitrogen to a concentration of $1\times10^{16}$ cm$^{-3}$ as an impurity is grown to a thickness of 0.2 to 0.5 μm, for example, by using epitaxial growth.

The step for forming a low-resistance layer (step S14) is a step in which an n-type low-resistance layer 34 is formed. In this step, an n-type low-resistance layer 34 composed of SiC doped with nitrogen to a concentration of $1\times10^{19}$ to $5\times10^{19}$ cm$^{-3}$ as an impurity is grown to a thickness of 0.2 to 0.4 μm, for example, by using epitaxial growth on the SiC layer 33.

Figure 5A:
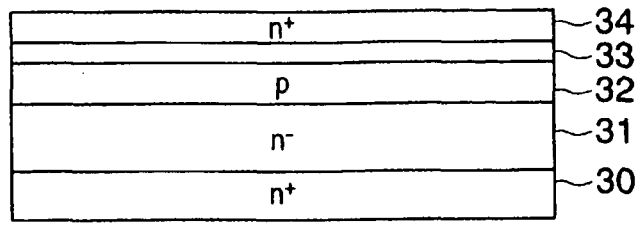
FIGS. 5A to 5D are cross-sectional views of the semiconductor substrate at each step for manufacturing a bipolar transistor by using the manufacturing method of the bipolar semiconductor device of the first example of the present invention.
Figure 5B:
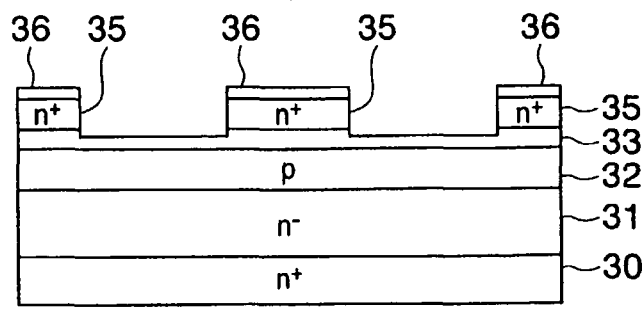

The step for forming emitter regions (step S15) is a step in which emitter regions 35 are formed by partially etching a portion of the n-type low-resistance layer 34 and the n-type high-resistance layer 33. In this step, a portion of the low-resistance layer 34 and n-type high-resistance layer 33 is partially etched in order to separate the emitter regions, as shown in FIG. 5B. A resist pattern is formed, for example, in a photolithography step using a CVD (chemical vapor deposition) silicon oxide film as an etching mask 36, and the CVD silicon oxide film is then etched by RIE (reactive ion etching) or the like. The SiC is thereafter etched using the CVD silicon oxide film as a mask. RIE or the like in which SF$_6$ or the like is used may be applied in order to etch the SiC. The etching depth is about 0.3 to 0.6 μm.

Figure 5C:
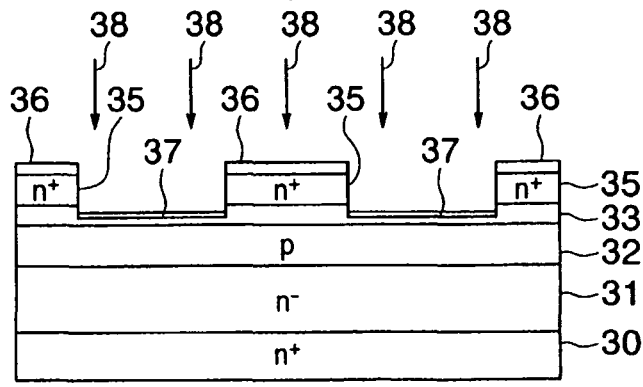

The step for forming a recombination-inhibiting semiconductor layer (step S16) is a step in which a p-type recombination-inhibiting semiconductor layer is formed in the vicinity of the surface of the high-resistance layer 33 exposed by etching. In this step, the emitter regions 35 are separated and ions are thereafter implanted as shown by the arrow 38 in order to form a recombination-inhibiting semiconductor layer 37, as shown in FIG. 5C. In this case, the CVD silicon oxide film of the etching mask 36 used in the etching to separate the emitter regions 35 can also be used as the ion implantation mask, and a new photolithography step therefore is not required. For example, aluminum can be used as the ion species, the implantation energy is several tens of kiloelectronvolts, and the implantation amount is determined so that the impurity concentration is about $1\times10^{16}$ to $1\times10^{17}$ cm$^{-3}$. The recombination-inhibiting semiconductor layer 37, which is a p-type region, does not have a function such as that of the base region 32, but is designed to reduce the concentration of positive holes from the base region 32 on the surface while simultaneously keeping electrons from the emitter regions 35 away from the surface, and is therefore set to a low implantation amount in comparison with the base region 32.

Figure 5D:
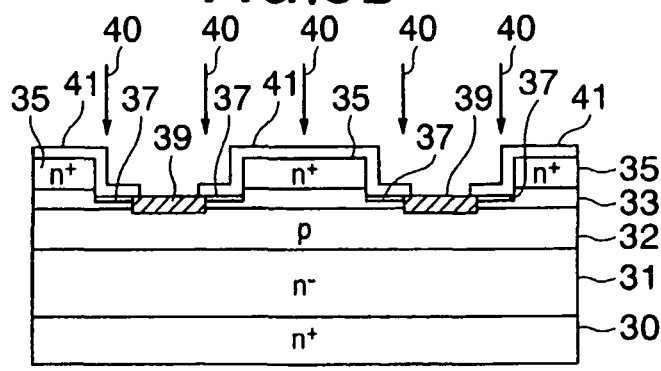

The step for forming a base contact region (step S17) is a step in which a base contact region 39 joined to the base region 32 is formed. In this step, selective ion implantation is carried out in the area in which the base electrode is to be formed, in order to form the base contact region 39 joined to the base region 32, as shown in FIG. 5D. This step increases the impurity concentration of the semiconductor surface in order to reduce the contact resistance between the metal electrodes and the semiconductor. A CVD silicon oxide film can be used as the material of the mask 41 for the ion implantation indicated by the arrow 40. Aluminum is used as the ion species. The ions are implanted at a maximum implantation energy of about 300 keV in multiple stages in order to obtain an ion implantation depth of about 0.2 to 0.4 μm. The implantation amount is determined so that the impurity concentration is about $1\times10^{18}$ to $1\times10^{19}$ cm$^{-3}$. After ion implantation, the mask 41 is removed by etching.

Figure 6A:
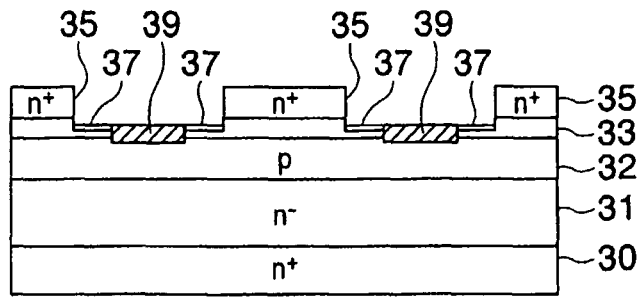
FIGS. 6A to 6D are cross-sectional views of the semiconductor substrate at each step for manufacturing a bipolar transistor by using the manufacturing method of the bipolar semiconductor device of the first example of the present invention.

Next, ion implantation is followed by an activation heat treatment in order to electrically activate the implanted ions in the semiconductor and to eliminate crystal defects that are created by ion implantation, as shown in FIG. 6A. In the present example, activation is simultaneously carried out both for the ion implantation that forms the recombination-inhibiting semiconductor layer 37 and for the ion implantation that forms the base contact region 39. The heat treatment is carried out for about 10 minutes at a high temperature of about 1,700 to 1,800° C. using a high-frequency heat treatment oven or the like, for example. Argon is used as the ambient gas.

The step for forming a recombination-inhibiting film (step S18) is a step in which a recombination-inhibiting film 42 is formed on the surface of the semiconductor crystal between the base contact region 39 and emitter regions 35. To remove the surface layer formed in the ion implantation and activation heat treatment steps, thermal oxidation is first carried out in this step, and sacrificial oxidation is performed to remove the oxide film formed thereby. Conditions for the sacrificial oxidation include 1,100° C. for 20 hours in dry oxygen, for example. Hydrofluoric acid is used to remove the oxide film. After sacrificial oxidation, a heat treatment is carried out again to form an oxide film. Another heat treatment (POA: Post Oxidation Annealing) is thereafter carried out to reduce the impurity states at the SiC-oxide film boundary. POA is carried out at a high temperature of about 800 to 1,300° C. in an environment of hydrogen and oxygen nitride (NO, N$_2$O).

Figure 6B:
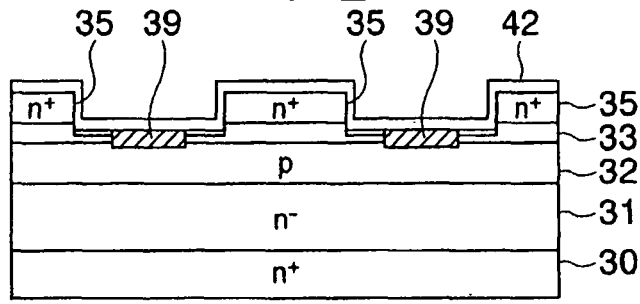

After POA, a CVD oxide film, a CVD nitride film, or another thin film 42 (recombination-inhibiting film) is formed (FIG. 6B).

Figure 6C:
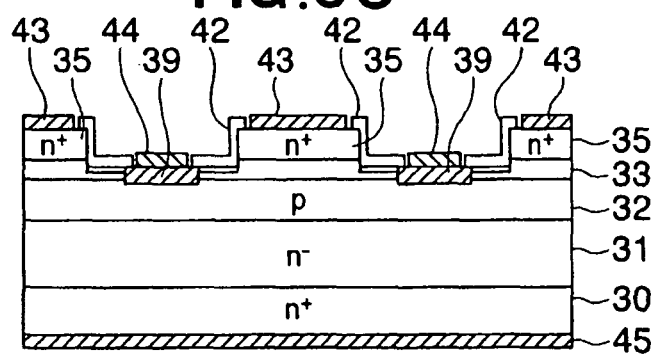

The step for forming electrodes (step S19) is a step in which a base electrode, emitter electrodes, and a collector electrode are formed. Formed in this step are emitter electrodes 43, a base electrode 44, and a collector electrode 45 joined to the emitter regions 35, base contact region 39, and collector region 30, respectively, as shown in FIG. 6C. The metal used in the emitter electrodes 43 and the collector electrode 45 is nickel or titanium, for example; and the metal used in the base electrode 44 is titanium/aluminum, for example. Each of the electrodes is formed by vapor deposition, sputtering, or the like. The patterns are formed by photolithography and dry etching, wet etching, lift-off, or another method. The electrode formation is followed by a heat treatment in order to reduce contact resistance between the metal of the electrodes and the SiC semiconductor of the emitter regions 35, base contact region 39, and collector region 30. The heat treatment conditions are 800 to 1,000° C. for about 10 to 30 minutes, for example.

Figure 6D:
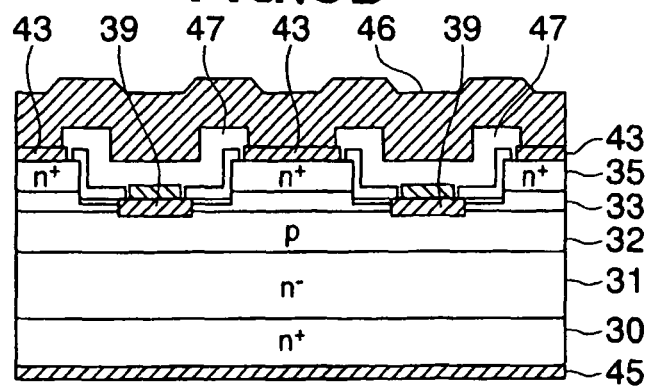
Figure 9:
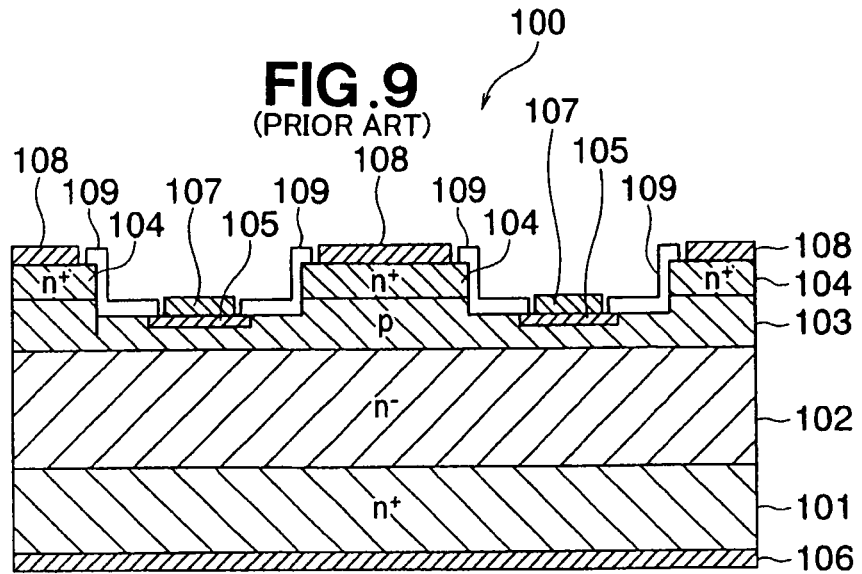
FIG. 9 is a cross-sectional schematic view of a conventional bipolar transistor.

The step for forming the upper electrode (step S20) is a step in which an upper electrode is formed on the base electrode 44 and emitter electrodes 43. In this step, an upper electrode 46 is formed to bring out the separated emitter electrodes 43 to a single electrode, as shown in FIG. 6D. A CVD oxide film or the like is formed as an interlayer film 47, and the CVD oxide film or the like is thereafter removed from the areas of the emitter electrodes 43 and base electrode 44 by photolithography and etching. The emitter electrodes 43 and base electrode 44 are exposed and the upper electrode 46 is then deposited. Aluminum is used as the material of the upper electrode 46.

The high-performance bipolar transistor 10 shown in FIGS. 1 and 2 can be manufactured in the manner described above.

FIG. 7 shows a cross-sectional view of the bipolar semiconductor device (bipolar transistor) of the second example. The bipolar transistor 50 has a collector region 51 composed of an n-type low-resistance layer ($n^+$ layer) formed on one of the surfaces of a silicon carbide (SiC) crystal, an n-type high-resistance layer ($n^-$ layer) 52 disposed on the collector region 51, a p-type base region 53 disposed on the n-type high-resistance layer 52, n-type low-resistance ($n^+$) emitter regions 54 formed on the other surface of the SiC crystal, and a p-type low-resistance ($p^+$) base contact region 56 joined to the base region 53 and disposed on both sides of an n-type high-resistance layer ($n^-$ layer) 55 at the periphery of the emitter regions 54. Also, the bipolar transistor 50 is provided with p-type recombination-inhibiting semiconductor layers 57 that are disposed in the vicinity of the surface of the SiC crystal between the base contact region 56 and the emitter regions 54. Furthermore, a recombination-inhibiting film 58 is disposed on the surface of the SiC crystal between the base contact region 56 and the emitter regions 54. There are also a collector electrode 59 joined to the collector region 51, emitter electrodes 60 joined to the emitter regions 54, and a base electrode 61 joined to the base contact region 56. In the bipolar transistor 50, the impurity concentration of the recombination-inhibiting semiconductor layer 57 is lower than the impurity concentration of the base region 53.

The difference from the bipolar transistor 10 of the first example is that a portion of the surface of the semiconductor between the base contact region 56 and the emitter regions 54 is sloped. In other words, the difference from the bipolar transistor 10 of the first example shown in FIG. 1 is that a slope is provided to the cross-sectional shape of the etching mask material when the emitter regions 54 are separated by etching in the emitter region formation step (step S15) shown in FIG. 4; or a slope is provided to the etching-side surface 54s of the emitter regions 54 by performing isotropic SiC etching or by using another method.

By providing the structure described above, the entire high-resistance layer exposed on the surface is covered by a p-type region because ions are implanted into the side surface of the emitter regions 54 during ion implantation to form the recombination-inhibiting semiconductor layer 57. The recombination-inhibiting effect of the bipolar transistor 50 is thereby improved in comparison with the bipolar transistor 10 of the first example.

FIG. 8 shows the bipolar semiconductor device (bipolar transistor) of the third example. The bipolar transistor 70 has a collector region 71 composed of an n-type low-resistance layer ($n^+$ layer) formed on one of the surfaces of a silicon carbide (SiC) crystal, an n-type high-resistance layer ($n^-$ layer) 72 disposed on the collector region 71, a p-type base region 73 disposed on the n-type high-resistance layer 72, n-type low-resistance ($n^+$) emitter regions 74 formed on the other surface of the SiC crystal, and a p-type low-resistance ($p^+$) base contact region 76 joined to the base region 73 and disposed on both sides of an n-type high-resistance layer ($n^-$ layer) 75 at the periphery of the emitter regions 74. Also, the bipolar transistor 70 is provided with p-type recombination-inhibiting semiconductor layers 77 that are disposed in the vicinity of the surface of the SiC crystal between the base contact region 76 and the emitter regions 74. Furthermore, a recombination-inhibiting film 78 is disposed on the surface of the SiC crystal between the base contact region 76 and the emitter regions 74. There are also a collector electrode 79 joined to the collector region 71, emitter electrodes 80 joined to the emitter regions 74, and a base electrode 81 joined to the base contact region 76. In the bipolar transistor 70, the impurity concentration of the recombination-inhibiting semiconductor layer 77 is lower than the impurity concentration of the base region 73.

The bipolar transistor 70 of the third example has a structure in which the surface of the semiconductor between the base contact region 76 and the emitter regions 74 is not stepped. The bipolar transistor 70 is an example in which the emitter regions 74 are separated by etching, but is formed by selective ion implantation. In the present structure, it is possible to further inhibit the recombination of electrons and positive holes in the vicinity of the semiconductor surface because the semiconductor surface is not damaged by etching, due to the fact that an etching step is not used. Phosphorus and nitrogen can be used as the ion species that are used for ion implantation during the formation of the emitter regions 74. The high-resistance layers 75 between the emitter regions 74 and the base contact region 76 may be left unchanged.

As described above, the present invention provides a recombination-inhibiting semiconductor layer of a second conductive type in the vicinity of the surface of the semiconductor crystal between the base contact region and the emitter regions. Providing a recombination-inhibiting semiconductor layer allows the semiconductor surface having a large number of surface states to be separated from the portion that primarily conducts the positive hole electric current and the electron current, and recombination is inhibited. The current amplification factor can thereby be improved and the ON voltage can be reduced. Also in the present invention, a recombination-inhibiting film is provided to reduce recombination on the semiconductor surface. The device characteristics can be further improved by combining the recombination-inhibiting film with the recombination-inhibiting semiconductor layer. The efficiency of a power conversion device can therefore be improved by using the bipolar transistor of the present invention. The thickness of the layers, the amount of ion implantation energy, and other specific numbers shown in the present examples are merely examples and may be suitably modified within the scope of implementing the present invention.

The above examples concerned cases in which the recombination-inhibiting semiconductor layers 17, 57, and 77 shown in FIGS. 1, 7, and 8 are p-type layers, but these may also be n-type layers. In such a case, the positive holes are kept away by the same principle as the examples described above, and recombination is inhibited. The recombination-inhibiting films 18, 58, and 78 are not necessarily essential components, but the recombination-inhibiting function in a semiconductor device is further improved by providing such a film. The present examples were described with reference to SiC, but the present invention may also be applied to other semiconductors in which surface recombination is a problem.

INDUSTRIAL APPLICABILITY

The present invention is used in order to realize a high-performance bipolar semiconductor device and is used in semiconductor device manufacturing technology.

The invention claimed is:

1. A manufacturing method for a bipolar semiconductor device, comprising the steps of:
    forming a first high-resistance layer of a first conductive type on one surface of a semiconductor substrate of the first conductive type;
    forming a base region of a second conductive type on the first high-resistance layer of the first conductive type;
    forming a second high-resistance layer of the first conductive type on the base region;
    forming a low-resistance layer of the first conductive type on the second high-resistance layer of the first conductive type;
    forming emitter regions by partially etching a portion of the low-resistance layer and the second high-resistance layer;
    forming a recombination-inhibiting semiconductor layer of the second conductive type in the vicinity of a surface of the second high-resistance layer that was exposed by the etching;
    forming a base contact region joined to the base region;
    joining a base electrode to the base contact region, emitter electrodes to the emitter regions, and a collector electrode to an opposite surface of the semiconductor substrate; and
    forming an upper-layer electrode above the base electrode and the emitter electrodes,
    wherein the recombination-inhibiting semiconductor layer is not joined to the base region, and
    the recombination-inhibiting semiconductor layer has an impurity concentration lower than an impurity concentration of the base region.

2. The manufacturing method for a bipolar semiconductor device according to claim 1, wherein the surface of the semiconductor substrate between the base contact region and the emitter regions is partly sloped.

3. The manufacturing method for a bipolar semiconductor device according to claim 1, wherein the surface of the semiconductor substrate between the base contact region and the emitter regions is not stepped.

4. The manufacturing method for a bipolar semiconductor device according to claim 1, wherein the surface of the semiconductor crystal substrate between the base contact region and the emitter regions is provided with a recombination-inhibiting film.

5. The manufacturing method for a bipolar semiconductor device according to claim 1, wherein the semiconductor substrate is silicon carbide.

6. The manufacturing method for a bipolar semiconductor device according to claim 1, wherein the opposite surface of the semiconductor substrate, to which the collector electrode is joined, is a bottom side of the bipolar semiconductor device.

7. A manufacturing method for a bipolar semiconductor device, comprising the steps of:
    forming a first high-resistance layer of a first conductive type on one surface of a semiconductor crystal of the first conductive type;
    forming a base region of a second conductive type on the first high-resistance layer of the first conductive type;
    forming a second high-resistance layer of the first conductive type on the base region;
    forming a low-resistance layer of the first conductive type on the second high-resistance layer of the first conductive type;
    forming emitter regions by partially etching a portion of the low-resistance layer and the second high-resistance layer;
    forming a recombination-inhibiting semiconductor layer of the second conductive type in the vicinity of a surface of the second high-resistance layer that was exposed by the etching;
    forming a base contact region joined to the base region;
    forming a recombination-inhibiting film on a surface of the semiconductor crystal between the base contact region and the emitter regions;
    joining a base electrode to the base contact region, emitter electrodes to the emitter regions, and a collector electrode to an opposite surface of the semiconductor substrate; and
    forming an upper-layer electrode above the base electrode and the emitter electrodes,
    wherein the recombination-inhibiting semiconductor layer is not joined to the base region, and
    the recombination-inhibiting semiconductor layer has an impurity concentration lower than an impurity concentration of the base region.

8. The manufacturing method for a bipolar semiconductor device according to claim 7, wherein the surface of the semiconductor crystal between the base contact region and the emitter regions is partly sloped.

9. The manufacturing method for a bipolar semiconductor device according to claim 7, wherein the surface of the semiconductor crystal between the base contact region and the emitter regions is not stepped.

10. The manufacturing method for a bipolar semiconductor device according to claim 7, wherein the semiconductor crystal is silicon carbide.

11. The manufacturing method for a bipolar semiconductor device according to claim 7, wherein the opposite surface of the semiconductor crystal, to which the collector electrode is joined, is a bottom side of the bipolar semiconductor device.

* * * * *